US012641922B2

(12) United States Patent
Jiang et al.

(10) Patent No.: US 12,641,922 B2
(45) Date of Patent: May 26, 2026

(54) LED CHIP BASED ON ALUMINA-SILICA COMPOSITE SUBSTRATE AND FABRICATION METHOD THEREOF

(71) Applicant: FOCUS LIGHTINGS TECH CO., LTD., Suzhou (CN)

(72) Inventors: Han Jiang, Suqian (CN); Hu Cheng, Suqian (CN); Yangyang Xu, Suqian (CN); Guochang Li, Suqian (CN); Zhijun Xu, Suqian (CN); Wenjun Wang, Suqian (CN)

(73) Assignee: FOCUS LIGHTINGS TECH CO., LTD., Suzhou (CN)

( * ) Notice: Subject to any disclaimer, the term of this patent is extended or adjusted under 35 U.S.C. 154(b) by 388 days.

(21) Appl. No.: 18/038,597

(22) PCT Filed: Mar. 22, 2023

(86) PCT No.: PCT/CN2023/083072
§ 371 (c)(1),
(2) Date: May 24, 2023

(87) PCT Pub. No.: WO2024/040958
PCT Pub. Date: Feb. 29, 2024

(65) Prior Publication Data
US 2025/0081672 A1     Mar. 6, 2025

(30) Foreign Application Priority Data

Aug. 24, 2022     (CN) .......................... 202211021069.3

(51) Int. Cl.
H10H 20/815          (2025.01)
H10H 20/01           (2025.01)
(Continued)

(52) U.S. Cl.
CPC ...... H10H 20/815 (2025.01); H10H 20/0125 (2025.01); H10H 20/0137 (2025.01); *H10H 20/823* (2025.01); *H10H 20/824* (2025.01)

(58) Field of Classification Search
None
See application file for complete search history.

(56) References Cited

U.S. PATENT DOCUMENTS 8,765,501 B2 *  7/2014  Su .......................... C23C 16/06
                                        257/E21.096
2004/0147096 A1   7/2004  Kitaoka et al.
(Continued)

FOREIGN PATENT DOCUMENTS

CN          1518138 A        8/2004
CN        101840967 A        9/2010
(Continued)

OTHER PUBLICATIONS

German First Office Action regarding Application No. 112023000173.1, dated Apr. 8, 2024, with English translation.
(Continued)

*Primary Examiner* — Bilkis Jahan
(74) *Attorney, Agent, or Firm* — HOWARD M COHN and Associates, LLC

(57) ABSTRACT

The present application provides an LED chip based on an alumina-silica composite substrate and a fabrication method thereof. The LED chip comprises an alumina-silica composite PSS substrate, a composite buffer layer and an LED structural layer, wherein the composite buffer layer is epitaxially grown on the alumina-silica composite PSS substrate, and the LED structural layer is epitaxially grown on the composite buffer layer. The composite buffer layer comprises: an aluminium oxynitride/aluminium nitride layer and a silicon oxynitride layer, wherein the alumina in the alumina-silica composite PSS substrate is covered with the
(Continued)

aluminium oxynitride/aluminium nitride layer, and the silica in the alumina-silica composite PSS substrate is covered with the aluminium oxynitride/aluminium nitride layer and the silicon oxynitride layer in a staggered manner.

9 Claims, 6 Drawing Sheets

(51) Int. Cl.
    *H10H 20/823*     (2025.01)
    *H10H 20/824*     (2025.01)

(56)           References Cited

U.S. PATENT DOCUMENTS

| | | | |
|---|---|---|---|
| 2009/0057700 A1 | 3/2009 | Jin et al. | |
| 2013/0193480 A1* | 8/2013 | Sun | H01L 21/0242 |
| | | | 438/478 |
| 2013/0320353 A1 | 12/2013 | Kryiouk et al. | |
| 2014/0225123 A1* | 8/2014 | Arkun | H10H 20/841 |
| | | | 438/29 |

| | | | |
|---|---|---|---|
| 2015/0171263 A1* | 6/2015 | Nakatsu | H10H 20/811 |
| | | | 438/47 |
| 2018/0182615 A1* | 6/2018 | Okuno | H01L 21/0242 |
| 2018/0182914 A1* | 6/2018 | Okuno | H10H 20/856 |
| 2021/0193863 A1* | 6/2021 | Wildeson | H01L 21/02647 |
| 2022/0199860 A1 | 6/2022 | Lin | |

FOREIGN PATENT DOCUMENTS

| | | | |
|---|---|---|---|
| CN | 102576663 A | 7/2012 |
| CN | 103022278 A | 4/2013 |
| CN | 109786524 A | 5/2019 |
| CN | 114284415 A | 4/2022 |
| CN | 115692570 A | 2/2023 |

OTHER PUBLICATIONS

Chinese Decision to Grant regarding Chinese patent application No. 202211021069.3, mailed on Jun. 16, 2025, with English translation.
International Search Report and Written Opinion of the ISA issued in PCT/CN2023/083072, mailed Jun. 8, 2023; ISA/CN.

* cited by examiner

LED structural layer

SiOxNy

SiO2

AlN

AlOxNy

Al2O3

SiO2

Al2O3

AlN

SiO3

Al2O3 epitaxially growing an AlOxNy/AlN layer
via PVD on an Al2O3/SiO2 composite PSS
substrate to obtain a first substrate                    S100 epitaxially growing a SiOxNy layer via
MOCVD on the first substrate to obtain
a second substrate                                       S200 epitaxially growing an LED structural
layer on the second substrate                            S300

LED CHIP BASED ON ALUMINA-SILICA COMPOSITE SUBSTRATE AND FABRICATION METHOD THEREOF

CROSS-REFERENCE TO RELATED APPLICATION

The present application is a 371 U.S. National Phase of International Application No. PCT/CN2023/083072 filed on Mar. 22, 2023, which claims priority to Chinese Patent Applicatoin No. 202211021069.3, entitled "LED Chip Based on Alumina-silica Composite Substrate and Fabrication Method Thereof", filed on Aug. 24, 2022, to the China National Intellectual Property Administration, the entire contents of which are incorporated herein by reference.

FIELD OF THE PRESENT DISCLOSURE

The present application relates to the technical field of LED chips, and more particularly to an LED chip based on an alumina-silica composite substrate and a fabrication method thereof.

BACKGROUND OF THE PRESENT DISCLOSURE

LED (Light Emitting Diode) is a commonly used light-emitting device, which releases energy and emits light upon the recombination of electrons and holes. LED products are widely used in various industries, and play an important role in people's daily life and production. MOCVD (metal-organic chemical vapour deposition) method is mainly used in the industry to prepare the epitaxial wafer of LED, and PSS substrate (patterned sapphire substrate) is generally used. A mask for dry etching is grown on the PSS substrate material, and the mask is patterned with a standard photolith process, and the sapphire is etched using an ICP (inductively coupled plasma) etching technique and the mask is removed, while a GaN (gallium nitride) material is grown thereon, so that the vertical epitaxy of the GaN material transforms into a lateral epitaxy. On the one hand, the dislocation density of GaN epitaxial material can be effectively reduced, so that the non-radiative recombination in the active region can be reduced, the reverse leakage current can be decreased, and the lifetime of LED can be improved. On the other hand, the light emitted from the active region changes the exit angle of the totally reflected light through multiple scattering at the interface of GaN and sapphire substrate, which increases the probability of the light emitted from the inverted LED to exit from the sapphire substrate, thus improving the light extraction efficiency.

The LED market tends to be stable and routinely manufacture, and there is an increasing demand for higher order sophisticated products, particularly high light efficiency products. However, it is more difficult to improve the internal quantum efficiency, which makes it more important to improve the external quantum efficiency and light extraction efficiency. In order to improve the external quantum efficiency and light extraction efficiency in the industry, an alumina-silica ($Al_2O_3/SiO_2$) composite PSS substrate is generally used in combination with an LED barrier crystal underlayer, namely, an $Al_2O_3/SiO_2$ composite PSS substrate is used, a layer of AlN (aluminium nitride) is epitaxially grown on the $Al_2O_3/SiO_2$ composite PSS substrate pattern as a buffer layer, and then an LED structural layer is epitaxially grown on the buffer layer.

However, on the one hand, due to the growth rate of AlN and GaN materials, the difference between $Al_2O_3$ material and $SiO_2$ material in the pattern portion of $Al_2O_3/SiO_2$ composite PSS substrate is relatively large, such that the thickness uniformity of AlN buffer layer is poor. On the other hand, the $Al_2O_3/SiO_2$ composite PSS substrate has poor lattice quality in the $SiO_2$ pattern and $SiO_2$ material layer, and there are some problems such as high concentration of oxygen vacancy defects.

SUMMARY OF THE PRESENT DISCLOSURE

The present application provides an LED chip based on an alumina-silica composite substrate and a fabrication method thereof, so as to solve the problems of poor thickness uniformity and poor lattice quality of a buffer layer of AlN used.

In a first aspect, the present application provides an LED chip based on an alumina-silica composite substrate, comprising: an alumina-silica composite PSS substrate, a composite buffer layer and an LED structural layer, wherein the composite buffer layer is epitaxially grown on the alumina-silica composite PSS substrate, and the LED structural layer is epitaxially grown on the composite buffer layer; the composite buffer layer comprises an aluminium oxynitride/aluminium nitride layer and a silicon oxynitride layer, while the alumina in the alumina-silica composite PSS substrate is covered with the aluminium oxynitride/aluminium nitride layer, and the silica in the alumina-silica composite PSS substrate is covered with the aluminium oxynitride/aluminium nitride layer and the silicon oxynitride layer in a staggered manner; the aluminum oxynitride in the aluminum oxynitride/aluminum nitride layer is connected to the alumina-silica composite PSS substrate, and the aluminum nitride in the aluminum oxynitride/aluminum nitride layer is connected to the LED structural layer.

In some embodiments, a thickness of aluminum oxynitride in the aluminum oxynitride/aluminum nitride layer is 30%-60% of an overall thickness of the aluminum oxynitride/aluminum nitride layer.

In some embodiments, the aluminum oxynitride/aluminum nitride layer has a thickness of 100-250 A and the silicon oxynitride layer has a thickness of 100-300 A.

In a second aspect, the present application also provides a fabrication method of an LED chip for fabricating the LED chip based on an alumina-silica composite substrate of the first aspect, the fabrication method comprising: placing an alumina-silica composite PSS substrate into a physical vapour deposition apparatus, and epitaxially growing an aluminium oxynitride/aluminium nitride layer via physical vapour deposition to obtain a first substrate; placing the first substrate into a metal-organic chemical vapour deposition apparatus, and epitaxially growing a silicon oxynitride layer via metal-organic chemical vapour deposition to obtain a second substrate; epitaxially growing an LED structural layer on the second substrate.

In some embodiments, the step of obtaining a first substrate, by placing an alumina-silica composite PSS substrate into a physical vapour deposition apparatus, and epitaxially growing an aluminium oxynitride/aluminium nitride layer via physical vapour deposition, comprises: bombarding, with argon gas, under a nitrogen gas atmosphere in a chamber of the physical vapour deposition apparatus, an aluminium target material onto a surface of a basal plate of the alumina-silica composite PSS substrate via magnetron sputtering, introducing oxygen gas thereinto and reacting to obtain an aluminium oxynitride thin film epitaxially grown on the alumina-silica composite PSS substrate; ceasing oxygen supply, and reacting to obtain an aluminium nitride thin film epitaxially grown on the aluminium oxynitride layer, so as to obtain the first substrate.

In some embodiments, a sputtering power of the physical vapor deposition apparatus is set in the range of 3000-4500 W and a sputtering temperature is set in the range of 500-650° C.; a flow rate of introducing the oxygen gas is 2 sccm-6 sccm, and a time for introducing the oxygen gas is 30%-60% of a total time of the epitaxial growth of the physical vapour deposition.

In some embodiments, the step of obtaining a second substrate, by placing the first substrate into a metal-organic chemical vapour deposition apparatus, and epitaxially growing a silicon oxynitride layer via metal-organic chemical vapour deposition, comprises: performing, in the metal-organic chemical vapour deposition apparatus, a thermal treatment on the first substrate in a hydrogen atmosphere at a first pre-set temperature, wherein the thermal treatment is lasting for a first pre-set time; converting the atmosphere into a mixed atmosphere of nitrogen gas and ammonia gas, wherein the nitrogen gas is a carrier gas and ammonia gas is a reaction gas for providing a nitrogen source; performing a thermal displacement reaction at a second pre-set temperature to obtain a silicon oxynitride layer epitaxially grown on the first substrate, wherein the second pre-set temperature is less than the first pre-set temperature, and the thermal displacement reaction is lasting for a second pre-set time; maintaining a mixed atmosphere of nitrogen gas and ammonia gas, controlling and decreasing the temperature to a third pre-set temperature to perform an annealing treatment, wherein the third pre-set temperature is less than the second pre-set temperature and the annealing treatment is lasting for a third pre-set time, so as to obtain the second substrate.

In some embodiments, the first pre-set temperature is in the range of 1050° C.-1150° C. and the first pre-set time is in the range of 1-5 min; the second pre-set temperature is in the range of 800° C.-1000° C., and the second pre-set time is in the range of 5 min-20 min; the third pre-set temperature is in the range of 550° C.-650° C. and the third pre-set time is in the range of 20 min-30 min.

In some embodiments, the epitaxially grown aluminum oxynitride/aluminum nitride layer has a thickness of 100-250 A and the epitaxially grown silicon oxynitride layer has a thickness of 100-300 A.

The present application provides an LED chip based on an alumina-silica composite substrate and a fabrication method thereof, wherein the LED chip comprises an alumina-silica composite PSS substrate, a composite buffer layer and an LED structural layer, the composite buffer layer being epitaxially grown on the alumina-silica composite PSS substrate, and the LED structural layer being epitaxially grown on the composite buffer layer. The composite buffer layer comprises: an aluminium oxynitride/aluminium nitride layer and a silicon oxynitride layer, wherein the alumina in the alumina-silica composite PSS substrate is covered with the aluminium oxynitride/aluminium nitride layer, and the silica in the alumina-silica composite PSS substrate is covered with the aluminium oxynitride/aluminium nitride layer and the silicon oxynitride layer in a staggered manner; the aluminum oxynitride in the aluminum oxynitride/aluminum nitride layer is connected to the alumina-silica composite PSS substrate, and the aluminum nitride in the aluminum oxynitride/aluminum nitride layer is connected to the LED structural layer. The composite buffer layer has better thickness uniformity on the alumina and silica materials, and can better buffer the lattice mismatch and stress release from the alumina-silica composite PSS substrate to the LED barrier crystal underlayer due to different materials, thereby reducing the defects at the interface layer.

BRIEF DESCRIPTION OF THE DRAWINGS

In order to explain the technical solution of the present application more clearly, the following contents will briefly introduce the drawings which need to be used in the embodiments, and it would be obvious for a person skilled in the art to obtain other drawings according to these drawings without involving any inventive effort.

DESCRIPTION OF THE EMBODIMENTS

Reference will now be made in detail to the embodiments, examples of which are illustrated in the accompanying drawings. Where the following description refers to the accompanying drawings, like numbers in different figures indicate the same or similar elements, unless otherwise indicated. The implementations described in the following embodiments do not represent all implementations consistent with the present application. These are merely examples of systems and methods consistent with certain aspects of the present application as detailed in the claims.

Epitaxial growth refers to the growth of a single-crystal layer on a single-crystal substrate (basal sheet) with a certain requirement and the same crystal orientation as the substrate, as if the original crystal had extended to a certain extent. There are various methods for growing epitaxial layers, for example: liquid phase epitaxy (LPE), physical vapour deposition (PVD), metal-organic chemical vapor deposition (MOCVD), hydride vapor phase epitaxy (HVPE), molecular beam epitaxy (MBE), etc. In general, MOCVD epitaxial process is the most widely used for industrial production.

MOCVD is a new vapor phase epitaxial growth technique developed on the basis of vapor phase epitaxy (VPE). MOCVD is a method in which organic compounds of group III and group II elements and hydrides of group V and group VI elements are used as crystal growth source materials, and various III-V main group and II-VI sub-group compound semiconductors and their multi-component solid solutions are grown on a substrate via vapor phase epitaxy in a thermal decomposition reaction to provide a thin-layer single-crystal material. MOCVD has the advantages of precise crystal growth control, good repeatability, large yield and suitable for industrial production.

The PVD technique is a technique comprising: physically vaporizing the surface of a material source (solid or liquid) into gaseous atoms, molecules or partially ionizing same into ions under vacuum, and depositing a thin film having a certain special function on the surface of a substrate through a low-pressure gas (or plasma) process.

Figure 2:
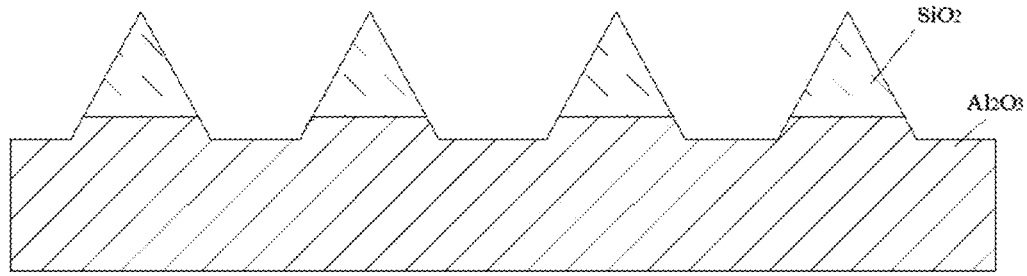
FIG. 2 is a schematic diagram of a structure of an $Al_2O_3/SiO_2$ composite PSS substrate.
Figure 3:
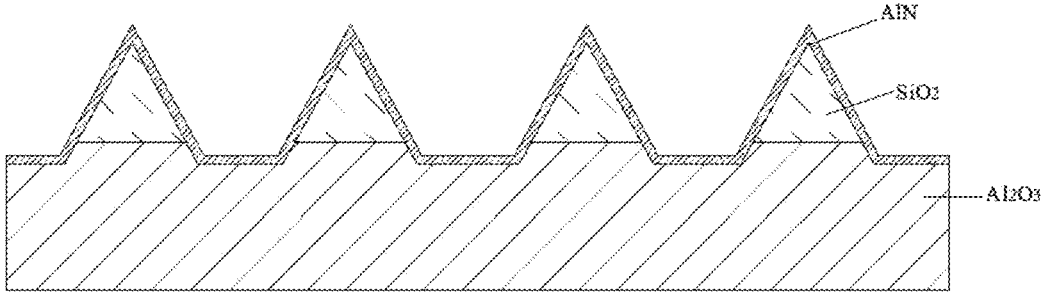
FIG. 3 is a schematic diagram of a structure of an AlN buffer layer.
Figure 4:
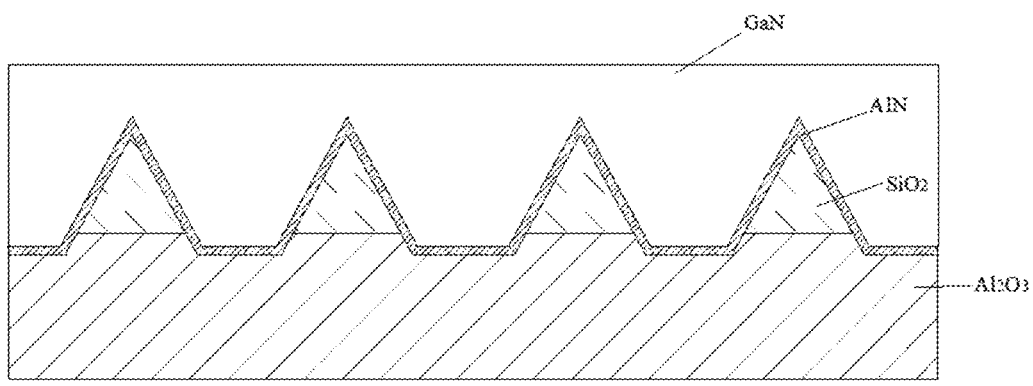
FIG. 4 is a schematic diagram of a structure of an LED chip with an AlN buffer layer.

In some embodiments, with reference to FIG. 2, an $Al_2O_3/SiO_2$ composite PSS substrate is shown. A layer of AlN (aluminum nitride) is epitaxially grown on the $Al_2O_3/SiO_2$ composite PSS substrate pattern as a buffer layer, see FIG. 3. An LED structural layer is then epitaxially grown on the AlN buffer layer, see FIG. 4.

Figure 5:
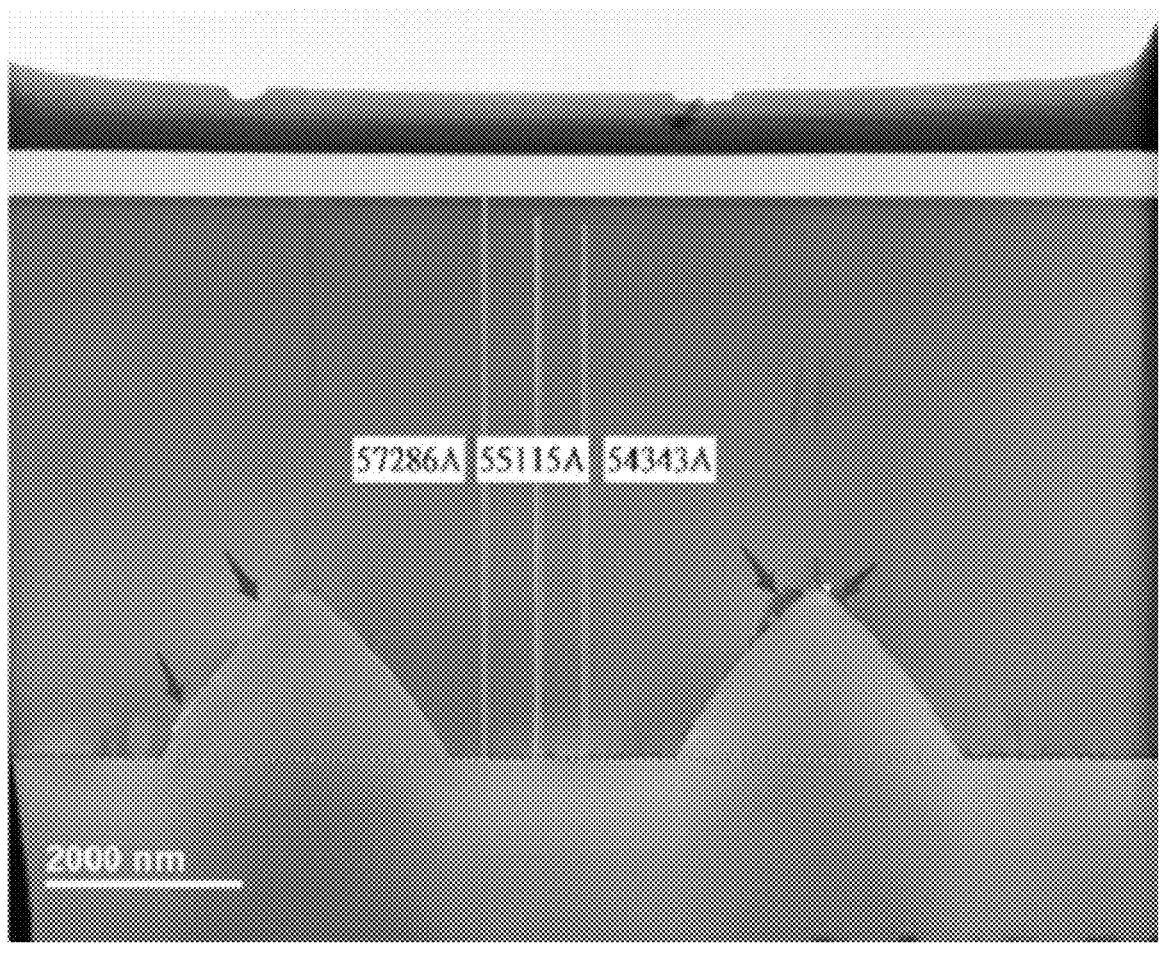
FIG. 5 is TEM image I of an LED chip with an AlN buffer layer.
Figure 6:
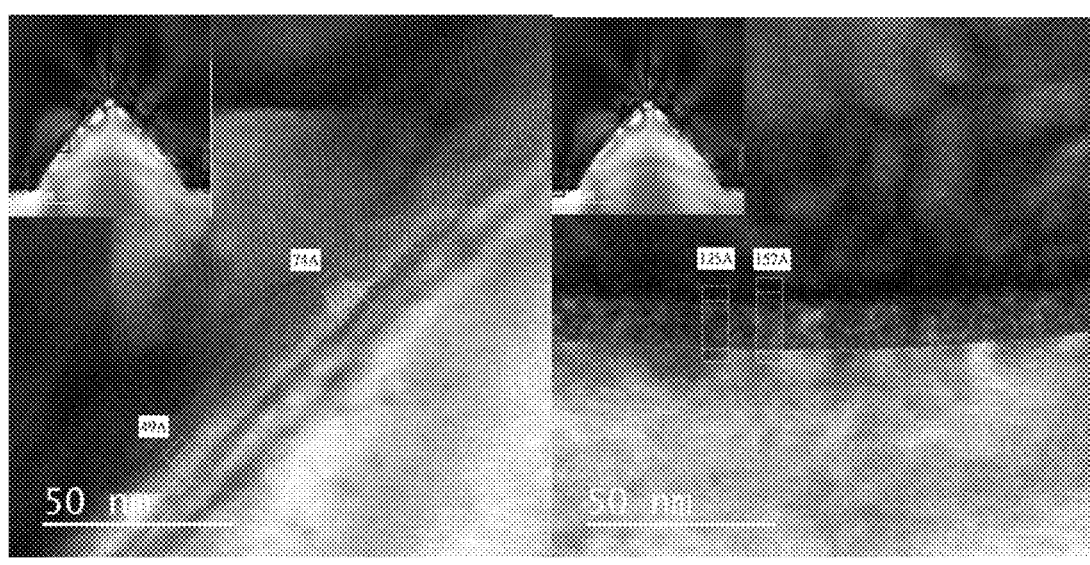
FIG. 6 is TEM image II of an LED chip with an AlN buffer layer.

However, on the one hand, due to there is a relatively large difference between the growth rates of the AlN and GaN materials on the $Al_2O_3$ material and on the $SiO_2$ material in the $Al_2O_3/SiO_2$ composite PSS substrate pattern section. On the other hand, $SiO_2$ material layer in the $SiO_2$ pattern of the $Al_2O_3/SiO_2$ composite PSS substrate has poor lattice quality, and there are some problems such as high concentration of oxygen vacancy defects. FIGS. 5 and 6 are microscopic images obtained using a transmission electron microscope (TEM) in the foregoing embodiments. As can be seen from FIG. 6, a thickness of the AlN buffer layer on the $SiO_2$ material of a pattern portion of the $Al_2O_3/SiO_2$ composite PSS substrate is 49 A and 74 A, while a thickness of the AlN buffer layer on the $Al_2O_3$ material of a pattern portion of the $Al_2O_3/SiO_2$ composite PSS substrate is 125 A and 152 A. It can be seen that the thickness difference between the those two is nearly doubled, and the thickness uniformity is not good. However, it can be seen clearly from the arrow positions in FIG. 5 that oxygen vacancy defects exist in the $SiO_2$ pattern portion of the $Al_2O_3/SiO_2$ composite PSS substrate.

Figure 1:
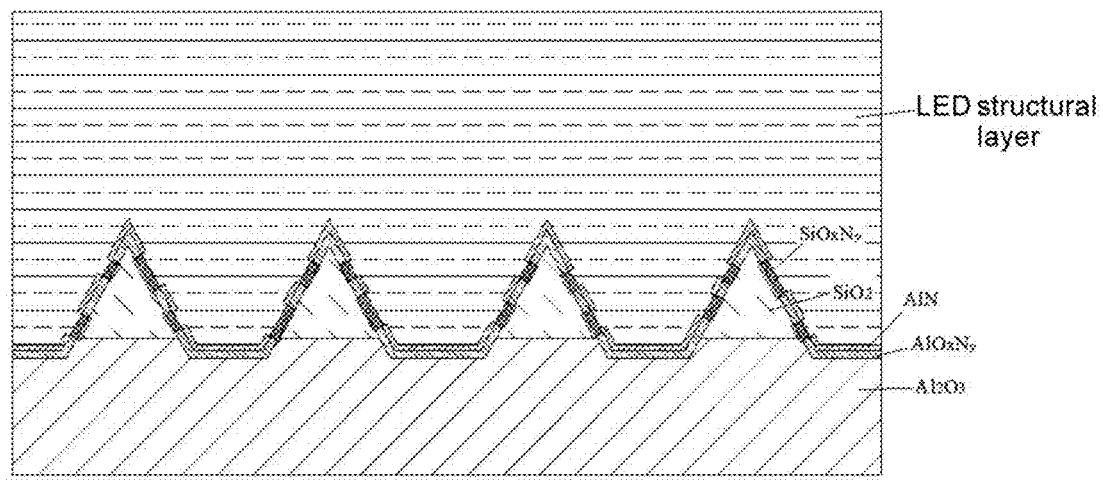
FIG. 1 is a schematic diagram of a structure of an LED chip based on an alumina-silica composite substrate provided in accordance with some embodiments of the present application.

In order to solve the above-mentioned problem, the present application provides an LED chip based on an alumina-silica composite substrate, and with reference to FIG. 1, the chip comprises: an alumina-silica ($Al_2O_3/SiO_2$) composite PSS substrate, a composite buffer layer and an LED structural layer, wherein the composite buffer layer is epitaxially grown on the alumina-silica composite PSS substrate, and the LED structural layer is epitaxially grown on the composite buffer layer.

The composite buffer layer is used for better buffering the lattice mismatch and stress release from the $Al_2O_3/SiO_2$ composite PSS substrate to the LED barrier crystal underlayer due to different materials, and reducing the defects at the interface layer. The LED structural layer is the main working structural layer of LED. Exemplarily, the LED structural layer may include: a U-type GaN layer, an N-type GaN layer, a stress releasing layer, an electron enrichment layer, a multiple quantum well layer and a P-layer. The U-shaped GaN layer is used as the LED barrier crystal underlayer to improve the external quantum efficiency and light extraction efficiency. The N-type GaN layer is used for forming an N-type region of the LED, wherein an electron provided by the N-type region recombines with a hole in the quantum well to excite light, which is one of the main structures of the LED. The stress releasing layer is used for releasing stress between lattices. An electron enrichment layer is used for an enrichment effect for electrons in the N-type region. Multiple quantum well (MQW) refer to a system in which multiple quantum wells are combined. In terms of material structure and growth process, there is no substantial difference between multiple quantum wells and superlattices, only in that the potential barrier layer of the superlattice is relatively thin, and the coupling between potential wells is strong, thereby forming microstrip, while the potential barrier layer between multiple quantum wells is thick, and there is substantially no tunneling coupling, and no microstrip is formed. The multiple quantum well structure is mainly used for its optical properties, which is one of the basic structural layers of LED epitaxial structure. The P layer, used to form the P-type region of the LED, is one of the main structures of the LED.

The composite buffer layer comprises: an aluminium oxynitride/aluminium nitride layer (AlOxNy/AlN) and a silicon oxynitride layer (SiOxNy), wherein the alumina in the alumina-silica composite PSS substrate is covered with the aluminium oxynitride/aluminium nitride layer, and the silica in the alumina-silica composite PSS substrate is covered with the aluminium oxynitride/aluminium nitride layer and the silicon oxynitride layer in a staggered manner. The aluminum oxynitride (AlOxNy) in the aluminum oxynitride/aluminum nitride layer is connected to the alumina-silica composite PSS substrate, and the aluminum nitride (AlN) in the aluminum oxynitride/aluminum nitride layer is connected to the LED structural layer.

In one exemplary embodiment, a thickness of aluminum oxynitride in the aluminum oxynitride/aluminum nitride layer is 30%-60% of an overall thickness of the aluminum oxynitride/aluminum nitride layer, which is configured to reduce lattice defects and make the lattice denser.

In one exemplary embodiment, the aluminum oxynitride/aluminum nitride layer has a thickness of 100-250 A and the silicon oxynitride layer has a thickness of 100-300 A, which is configured to better buffer lattice mismatch and stress release due to different materials, and reduce defects at the interface layer.

Figure 7:
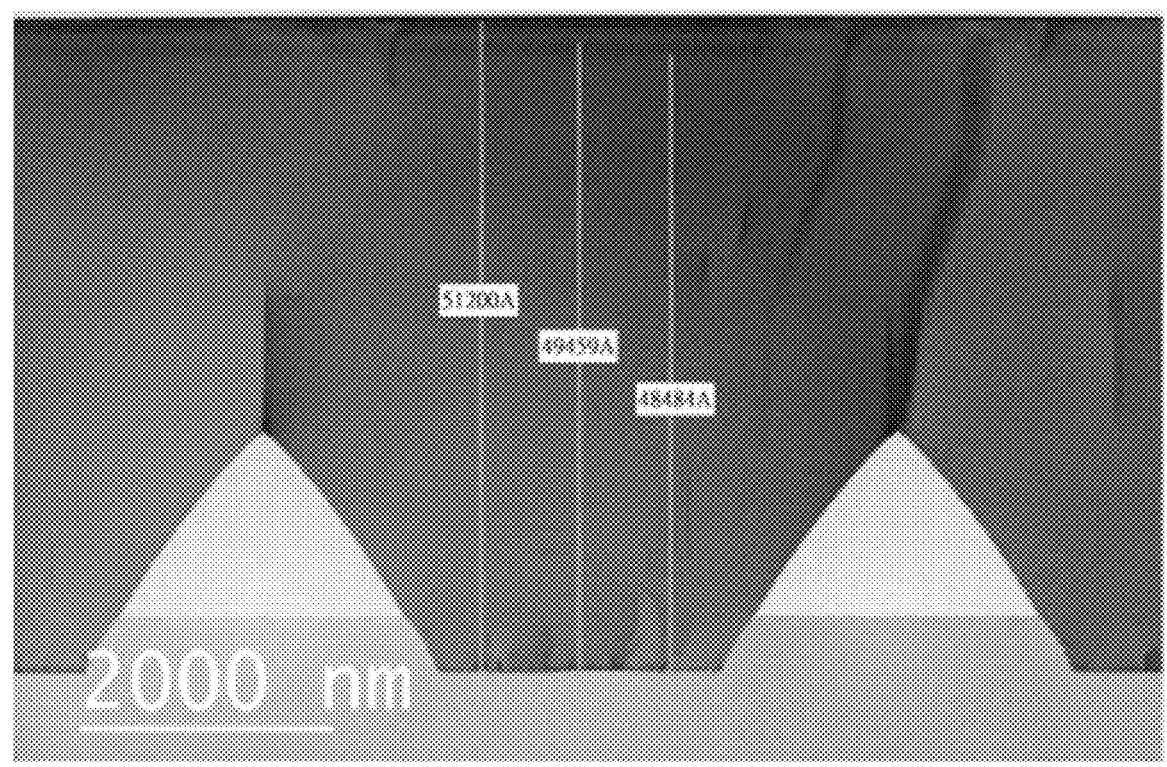
FIG. 7 is TEM image I of an LED chip based on an alumina-silica composite substrate provided in accordance with some embodiments of the present application.
Figure 8:
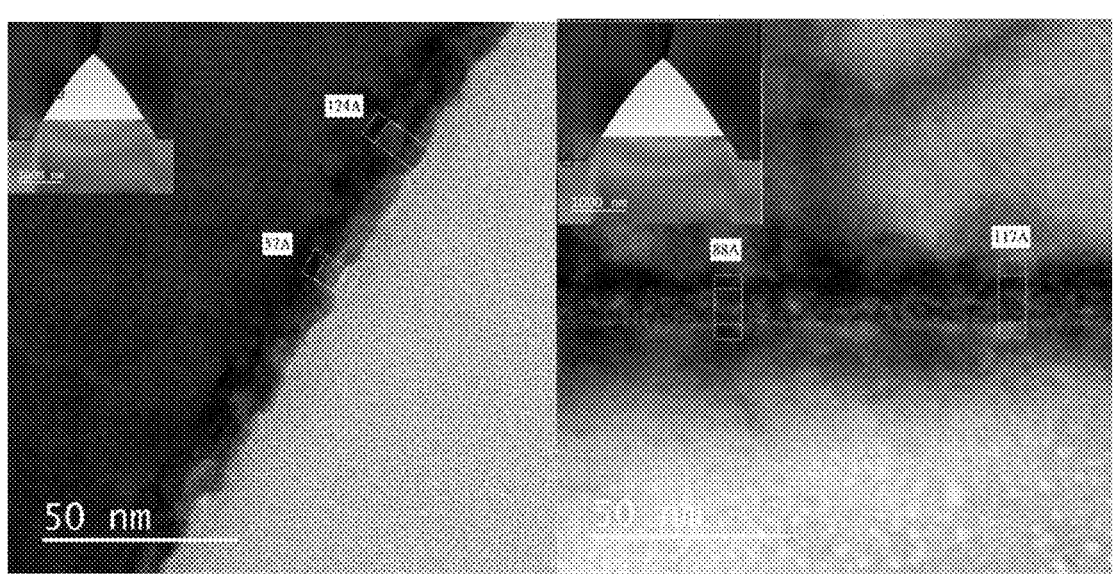
FIG. 8 is TEM image II of an LED chip based on an alumina-silica composite substrate provided in accordance with some embodiments of the present application.

FIGS. 7 and 8 are TEM images I and II, respectively, of an LED chip based on an alumina-silica composite substrate provided in accordance with some embodiments of the present application. It can be seen from FIG. 8 that a thickness of the composite buffer layer on the $SiO_2$ material of a pattern portion of the $Al_2O_3/SiO_2$ composite PSS substrate is 57 A and 124 A, while a thickness of the composite buffer layer on the $Al_2O_3$ material of the pattern portion of the $Al_2O_3/SiO_2$ composite PSS substrate is 88 A and 117 A, and it can be seen that the thickness of the two layers is not so different. However, no obvious lattice defect can be seen from the $SiO_2$ pattern portion of the $Al_2O_3/SiO_2$ composite PSS substrate in FIG. 7, and the crystal lattice thereof is denser.

Figure 9:
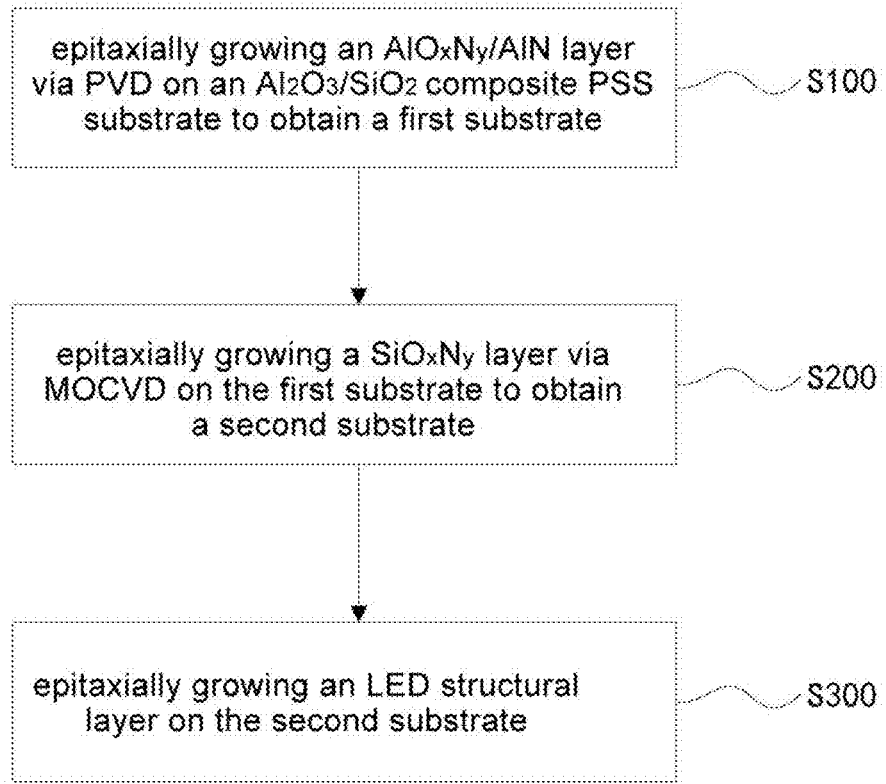
FIG. 9 is a schematic flow diagram of a fabrication method of an LED chip based on an alumina-silica composite substrate provided in accordance with some embodiments of the present application.

Based on the above-mentioned embodiments, the present application also provides a fabrication method of an LED chip for preparing the LED chip based on an alumina-silica composite substrate in the above-mentioned embodiments of the present application, and with reference to FIG. 9, the fabrication method comprises:

S100: an $Al_2O_3/SiO_2$ composite PSS substrate is placed into a physical vapour deposition (PVD) apparatus, and an AlOxNy/AlN layer is epitaxially grown via physical vapour deposition to obtain a first substrate.

Figure 11:
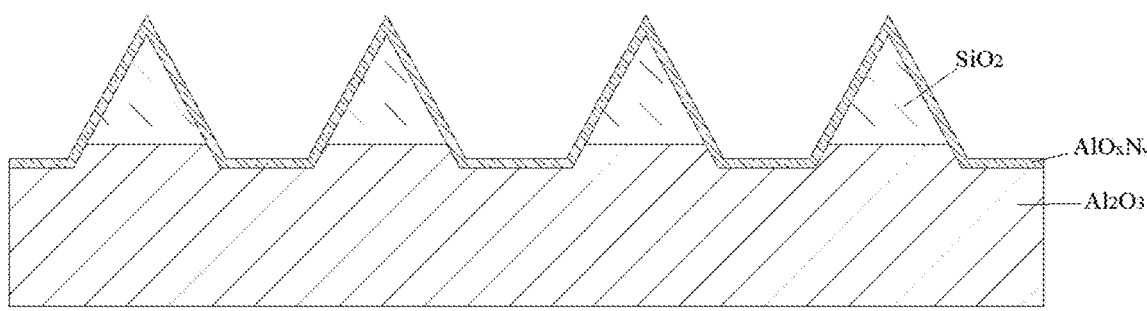
FIG. 11 is a schematic diagram of a structure for epitaxial growth of a AlOxNy layer on an $Al_2O_3/SiO_2$ composite PSS substrate provided in accordance with some embodiments of the present application.
Figure 12:
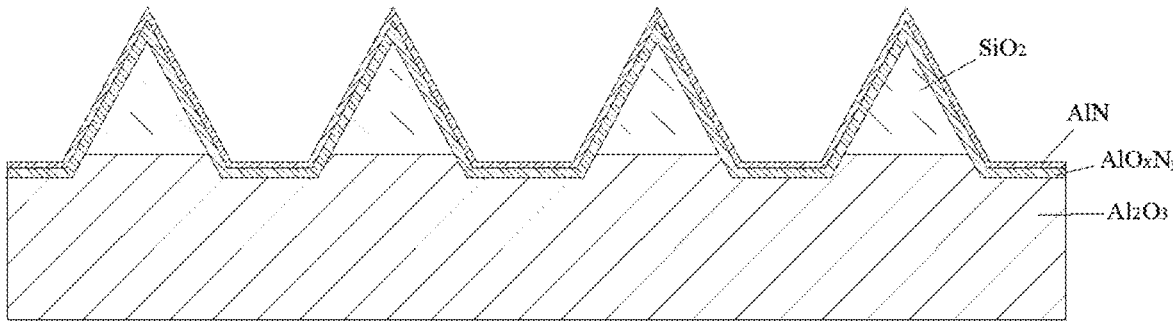
FIG. 12 is a schematic diagram of a structure for epitaxially growing an AlN layer on an AlOxNy layer provided in accordance with some embodiments of the present application.

In a chamber of PVD apparatus, a sputtering power of the PVD apparatus is set in the range of 3000-4500 W, and a sputtering temperature is set in the range of 500-650° C. In a nitrogen ($N_2$) atmosphere, an aluminium (Al) target is bombard, by argon (Ar) gas, onto a surface of a basal plate of the $Al_2O_3/SiO_2$ composite PSS substrate via magnetron sputtering. Firstly oxygen ($O_2$) is introduced at a flow rate of 2 sccm-6 sccm (standard cubic centimeters per minute) for reaction so as to obtain an AlOxNy thin film epitaxially grown on the $Al_2O_3/SiO_2$ composite PSS substrate. With reference to FIG. 11, a time for introducing $O_2$ is 30%-60% of an overall time for epitaxial growth of PVD, i.e., a thickness of the AlOxNy is 30%-60% of a total thickness of the AlOxNy/AlN layer. Thereafter, the oxygen supply is ceased, and the reaction results in an aluminium nitride (AlN) thin film epitaxially growing on the aluminium oxynitride (AlOxNy) layer, and with reference to FIG. 12, a first substrate is obtained, wherein the first substrate is an $Al_2O_3/SiO_2$ composite PSS substrate with a PVD deposited AlOxNy/AlN layer.

Figure 10:
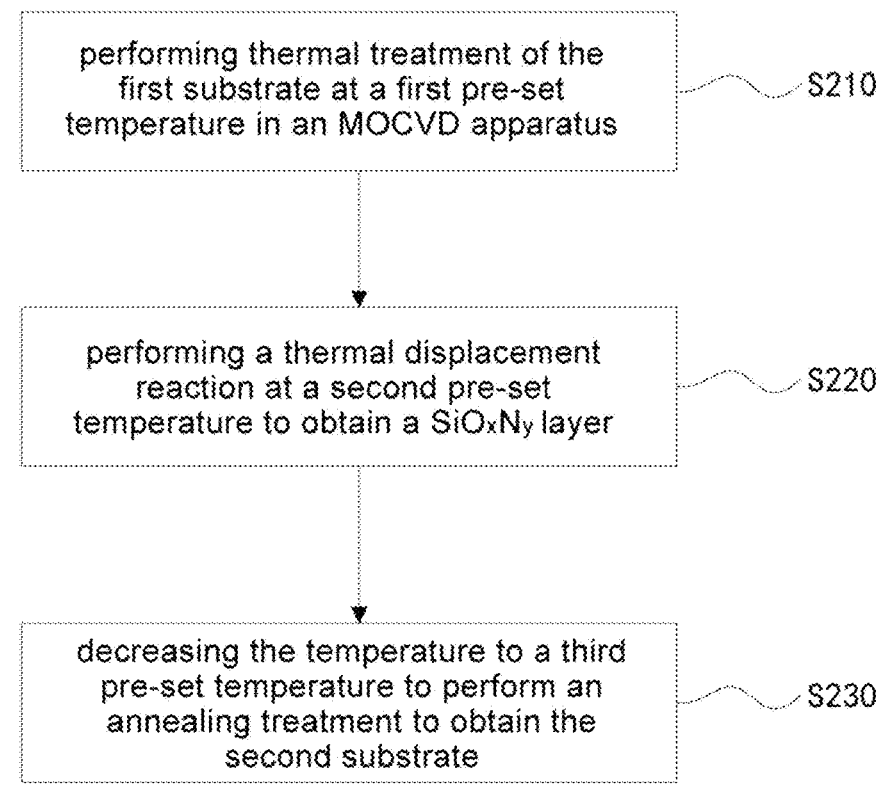
FIG. 10 is a schematic flow diagram of epitaxial growth of a SiOxNy layer from MOCVD on a first substrate to obtain a second substrate provided in accordance with some embodiments of the present application.

S200: the first substrate is placed into a metal-organic chemical vapour deposition apparatus, and a silicon oxynitride layer is epitaxially grown via metal-organic chemical vapour deposition to obtain a second substrate, and with reference to FIG. 10, S200 is implemented by S210-S230.

S210: in the MOCVD apparatus, the first substrate is thermally treated at a first pre-set temperature.

The first substrate is transferred to a metal-organic chemical vapor deposition (MOCVD) apparatus in which the first substrate is subjected to a thermal treatment in a hydrogen ($H_2$) atmosphere at a first pre-set temperature. Exemplarily, the first pre-set temperature is in the range of 1050° C.-1150° C. The thermal treatment is continued for a first pre-set time. Exemplarily, the first pre-set time is in the range of 1-5 min.

Figure 13:
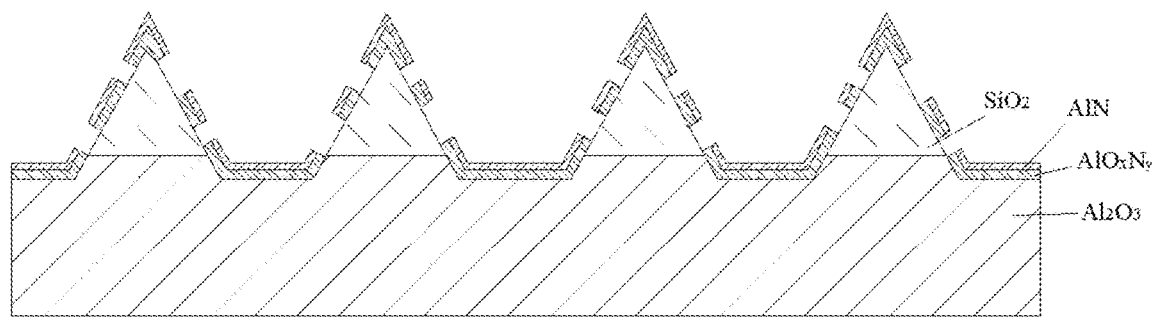
FIG. 13 is a schematic diagram of a structure after thermal treatment of an AlOxNy/AlN layer provided in accordance with some embodiments of the present application.

With reference to FIG. 13, the AlOxNy/AlN layer at a surface layer of $SiO_2$ pattern is difficult to grow by deposition, and the SEM scan shows that the growth morphology is an irregular discontinuous distribution of a non-thin film type. Therefore, thermal treatment is required to remove impurities such as water and oxygen in the surface layer of the substrate, and in the process of high temperature, the composite substance of AlOxNy/AlN layer deposited on the surface layer part of $SiO_2$ can experience agglomeration effect to form granular particles with a larger interval, thereby exposing a larger area of the surface layer of $SiO_2$.

S220: a thermal displacement reaction is performed at a second pre-set temperature to obtain a SiOxNy layer.

Figure 14:
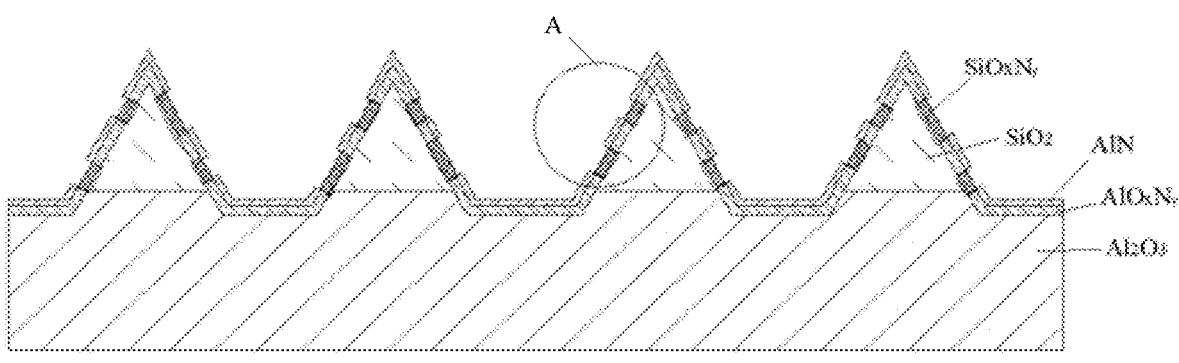
FIG. 14 is a schematic diagram of a structure of a composite buffer layer provided in accordance with some embodiments of the present application.

The atmosphere is converted into a mixed atmosphere of nitrogen (N2) and ammonia ($NH_3$), wherein $N_2$ is a carrier gas and $NH_3$ is a reaction gas, so as to provide a nitrogen (N) source, and the thermal displacement reaction is performed at a second pre-set temperature, wherein the second pre-set temperature is lower than the first pre-set temperature. Exemplarily, the second pre-set temperature is in the range of 800° C. to 1000° C., and the reaction results in epitaxial growth of a SiOxNy layer on the first substrate. With reference to FIG. 14, the thermal displacement reaction is continued for a second pre-set time. Exemplarily, the second pre-set time is in the range of 5 min-20 min to control the thickness and N substitution component concentration of the SiOxNy layer on the $SiO_2$ surface layer.

S230: the temperature is decreased to a third pre-set temperature for an annealing treatment to obtain a second substrate.

Figure 15:
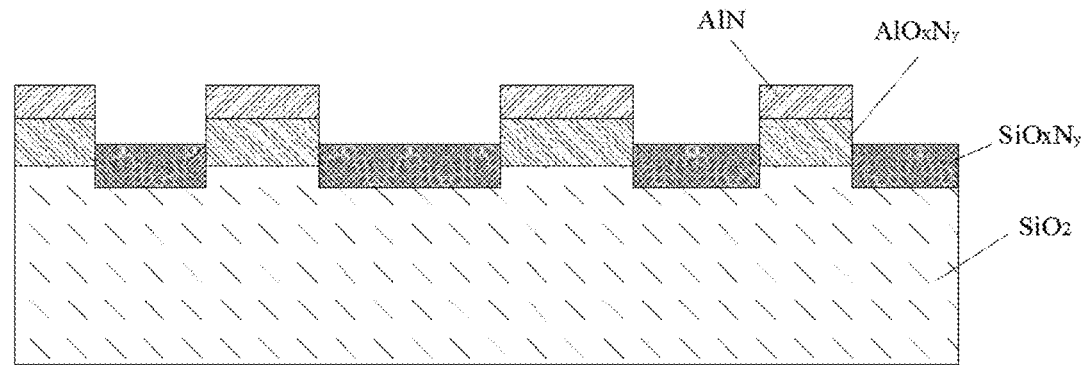
FIG. 15 is a partially enlarged structural schematic diagram at A in FIG. 14.

The mixed atmosphere of $N_2$ and $NH_3$ is still maintained, and the temperature is controlled to reduce to a third pre-set temperature for annealing treatment, wherein the third pre-set temperature is less than the second pre-set temperature. Exemplarily, the third pre-set temperature is in the range of 550° C.-650° C., and the annealing treatment is continued for a third pre-set time. Exemplarily, the third pre-set time is in the range of 20 min-30 min, so as to remove a large amount of H impurities existing in the surface layer of the SiOxNy thin film generated in the thermal replacement reaction in step S220. A second substrate is obtained after annealing, with reference to FIG. 14. The second substrate is an $Al_2O_3/SiO_2$ composite PSS substrate with a composite buffer layer, and the composite buffer layer comprises: an AlOxNy/AlN layer and a SiOxNy layer, wherein the $Al_2O_3$ in the $Al_2O_3/SiO_2$ composite PSS substrate is covered with the AlOxNy/AlN layer, and the $SiO_2$ in the $Al_2O_3/SiO_2$ composite PSS substrate is covered with the AlOxNy/AlN layer and the SiOxNy layer in a staggered manner, with reference to FIG. 15. Exemplarily, a thickness of the epitaxially grown AlOxNy/AlN layer is 100-250 A and a thickness of the epitaxially grown SiOxNy layer is 100-300 A.

S300: an LED structural layer is epitaxially grown on the second substrate.

Exemplarily, LED structural layers such as a U-type GaN layer, an N-type GaN layer, a stress release layer, an electron enrichment layer, a multiple quantum well layer and a P layer can be epitaxially grown successively on the second substrate, and any method can be used for epitaxially growing the LED structural layers, and the description thereof in detail is omitted in the present application.

FIGS. 7 and 8 are TEM images of LED chips manufactured using the above-described fabrication method. It can be seen from FIG. 8 that a thickness of the composite buffer layer on the $SiO_2$ material of a pattern portion of the $Al_2O_3/SiO_2$ composite PSS substrate is 57 A and 124 A, while a thickness of the composite buffer layer on the $Al_2O_3$ material of the pattern portion of the $Al_2O_3/SiO_2$ composite PSS substrate is 88 A and 117 A, and it can be seen that the thickness of the two layers is not so different. However, it can be seen from FIG. 7 that the $SiO_2$ pattern portion of the $Al_2O_3/SiO_2$ composite PSS substrate does not have apparent lattice defects, and the lattice thereof is denser. Compared with the LED chip in FIG. 5 and FIG. 6, the thickness uniformity of the composite buffer layer on the $Al_2O_3$ material and on the $SiO_2$ material of the $Al_2O_3/SiO_2$ composite PSS substrate is greatly improved, and there is no apparent lattice defect in the pattern portion of $SiO_2$, and the lattice quality is also greatly improved.

The present application provides an LED chip based on an alumina-silica composite substrate and a fabrication method thereof, wherein the LED chip comprises an alumina-silica composite PSS substrate, a composite buffer layer and an LED structural layer. A composite buffer layer is epitaxially grown on the alumina silica composite PSS substrate, and the LED structural layer is epitaxially grown on the composite buffer layer. The composite buffer layer comprises: an aluminium oxynitride/aluminium nitride layer and a silicon oxynitride layer, wherein the alumina in the alumina-silica composite PSS substrate is covered with the aluminium oxynitride/aluminium nitride layer, and the silica in the alumina-silica composite PSS substrate is covered with the aluminium oxynitride/aluminium nitride layer and the silicon oxynitride layer in a staggered manner. The aluminum oxynitride in the aluminum oxynitride/aluminum nitride layer is connected to the alumina-silica composite PSS substrate, and the aluminum nitride in the aluminum oxynitride/aluminum nitride layer is connected to the LED structural layer. The composite buffer layer has better thickness uniformity on the alumina and silica materials, and can better buffer the lattice mismatch and stress release from the alumina-silica composite PSS substrate to the LED barrier crystal underlayer due to different materials, thereby reducing the defects at the interface layer.

To the extent that similar elements between the embodiments provided herein are referred to with each other, the specific embodiments provided above are merely exemplary of the general concepts of the present application and are not intended to limit the scope of the present application. For a person skilled in the art, any other implementation extended according to the solution of the present application without involving any creative effort falls within the scope of protection of the present application.

What is claimed is:

1. An LED chip based on an alumina-silica composite substrate, comprising: an alumina-silica composite patterned sapphire substrate (PSS) substrate, a composite buffer layer and an LED structural layer, wherein the composite buffer layer is epitaxially grown on the alumina-silica composite PSS substrate, and the LED structural layer is epitaxially grown on the composite buffer layer;

the composite buffer layer comprises: an aluminum oxynitride/aluminum nitride layer and a silicon oxynitride layer;

the alumina in the alumina-silica composite PSS substrate is covered with the aluminum oxynitride/aluminum nitride layer, and the silica in the alumina-silica composite PSS substrate is covered with the aluminum oxynitride/aluminum nitride layer and the silicon oxynitride layer in a staggered manner;

the aluminum oxynitride in the aluminum oxynitride/aluminum nitride layer is connected to the alumina-silica composite PSS substrate, and the aluminum nitride in the aluminum oxynitride/aluminum nitride layer is connected to the LED structural layer.

2. The LED chip based on an alumina-silica composite substrate according to claim 1, characterized in that a thickness of aluminum oxynitride in the aluminum oxynitride/aluminum nitride layer is 30%-60% of an overall thickness of the aluminum oxynitride/aluminum nitride layer.

3. The LED chip based on an alumina-silica composite substrate according to claim 1, characterized in that the aluminum oxynitride/aluminum nitride layer has a thickness of 100-250 A and the silicon oxynitride layer has a thickness of 100-300 A.

4. A fabrication method of an LED chip for fabricating the LED chip based on an alumina-silica composite substrate according to claim 1, characterized in that the fabrication method comprises:

placing an alumina-silica composite PSS substrate into a physical vapour deposition apparatus, and epitaxially growing an aluminum oxynitride/aluminum nitride layer via physical vapour deposition to obtain a first substrate;

placing the first substrate into a metal-organic chemical vapour deposition apparatus, and epitaxially growing a silicon oxynitride layer via metal-organic chemical vapour deposition to obtain a second substrate;

epitaxially growing an LED structural layer on the second substrate.

5. The fabrication method of an LED chip according to claim 4, characterized in that the step of obtaining a first substrate, by placing an alumina-silica composite PSS substrate into a physical vapour deposition apparatus, and epitaxially growing an aluminum oxynitride/aluminum nitride layer via physical vapour deposition, comprises:

bombarding, with argon gas, under a nitrogen gas atmosphere in a chamber of the physical vapour deposition apparatus, an aluminum target material onto a surface of a basal plate of the alumina-silica composite PSS substrate via magnetron sputtering, introducing oxygen gas thereinto and reacting to obtain an aluminum oxynitride thin film epitaxially grown on the alumina-silica composite PSS substrate;

ceasing oxygen supply, and reacting to obtain an aluminum nitride thin film epitaxially grown on the aluminum oxynitride layer, so as to obtain the first substrate.

6. The fabrication method of an LED chip according to claim 5, characterized in that a sputtering power of the physical vapor deposition apparatus is set in the range of 3000-4500 W and a sputtering temperature is set in the range of 500-650° C.; a flow rate of introducing the oxygen gas is 2 sccm-6 sccm, and a time of introducing the oxygen gas is 30%-60% of an overall time of the epitaxial growth by the physical vapour deposition.

7. The fabrication method of an LED chip according to claim 4, characterized in that the step of obtaining a second substrate, by placing the first substrate into a metal-organic chemical vapour deposition apparatus, and epitaxially growing a silicon oxynitride layer via metal-organic chemical vapour deposition, comprises:

performing, in the metal-organic chemical vapour deposition apparatus, a thermal treatment on the first substrate in a hydrogen atmosphere at a first pre-set temperature, wherein the thermal treatment is lasting for a first pre-set time;

converting the atmosphere into a mixed atmosphere of nitrogen gas and ammonia gas, wherein the nitrogen gas is a carrier gas and ammonia gas is a reaction gas for providing a nitrogen source; performing a thermal displacement reaction at a second pre-set temperature to obtain a silicon oxynitride layer epitaxially grown on the first substrate, wherein the second pre-set temperature is less than the first pre-set temperature, and the thermal displacement reaction is lasting for a second pre-set time;

maintaining a mixed atmosphere of nitrogen gas and ammonia gas, controlling and decreasing the temperature to a third pre-set temperature to perform an annealing treatment, wherein the third pre-set temperature is less than the second pre-set temperature, and the annealing treatment is lasting for a third pre-set time, so as to obtain the second substrate.

8. The fabrication method of an LED chip according to claim 7, characterized in that the first pre-set temperature has a range of 1050° C.-1150° C. and the first pre-set time has a range of 1-5 min; the second pre-set temperature has a range of 800° C.-1000° C., and the second pre-set time has a range of 5 min-20 min; the third pre-set temperature has a range of 550° C.-650° C. and the third pre-set time has a range of 20 min-30 min.

9. The fabrication method of an LED chip according to claim 4, characterized in that the aluminum oxynitride/ aluminum nitride layer is epitaxially grown to a thickness of 100-250 A, and the silicon oxynitride layer is epitaxially grown to a thickness of 100-300 A.

5

* * * * *